(12) United States Patent
Liu et al.

(10) Patent No.: US 12,118,283 B1
(45) Date of Patent: Oct. 15, 2024

(54) AUTOMATIC CHANNEL IDENTIFICATION OF HIGH-BANDWIDTH MEMORY CHANNELS FOR AUTO-ROUTING

(71) Applicant: Synopsys, Inc., Sunnyvale, CA (US)

(72) Inventors: Xun Liu, Durham, NC (US); Gary K. Yeap, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/484,212

(22) Filed: Oct. 10, 2023

Related U.S. Application Data

(63) Continuation of application No. 17/406,924, filed on Aug. 19, 2021, now Pat. No. 11,816,407.

(60) Provisional application No. 63/068,958, filed on Aug. 21, 2020.

(51) Int. Cl.
*G06F 30/327* (2020.01)
*G06F 30/392* (2020.01)
*G06F 30/398* (2020.01)

(52) U.S. Cl.
CPC .......... *G06F 30/327* (2020.01); *G06F 30/392* (2020.01); *G06F 30/398* (2020.01)

(58) Field of Classification Search
CPC ...... G06F 30/327; G06F 30/39; G06F 30/392; G06F 30/398; G06F 30/394
USPC .......................................... 716/103
See application file for complete search history.

(56) References Cited

U.S. PATENT DOCUMENTS

| | | | |
|---|---|---|---|
| 6,823,501 B1 * | 11/2004 | Dahl | G06F 30/392 |
| | | | 716/139 |
| 10,289,796 B2 | 5/2019 | Rossi et al. | |
| 10,867,106 B1 * | 12/2020 | Gupta | G06F 30/3953 |
| 11,238,206 B1 | 2/2022 | Sivaswamy et al. | |
| 2016/0292344 A1 | 10/2016 | Griyage et al. | |
| 2019/0332561 A1 * | 10/2019 | Schreiber | G06F 13/385 |
| 2019/0370433 A1 | 12/2019 | Chiang et al. | |

* cited by examiner

*Primary Examiner* — Paul Dinh
(74) *Attorney, Agent, or Firm* — Fenwick & West LLP

(57) ABSTRACT

Methods and systems are described herein relate to automatic channel identification of high-bandwidth memory channels and subchannel generation. An HBM channel identification system may perform a sequence of operations to identify HBM channels within a netlist of an interposer: channel dimension prediction, channel bounding box prediction, channel orientation derivation, subchannel partition, and subchannel routing region creation. In one example, an HBM channel identification method includes identifying candidate nets within a netlist. A bounding box that includes one or more nets of the candidate nets is determined. Once the bounding box is determined, the orientation of the box is determined and used to determine a pattern of bumps within the bounding box. Finally, a subchannel is generated based on the pattern of bumps.

20 Claims, 8 Drawing Sheets

AUTOMATIC CHANNEL IDENTIFICATION OF HIGH-BANDWIDTH MEMORY CHANNELS FOR AUTO-ROUTING

CROSS REFERENCE TO RELATED APPLICATIONS

This application is a continuation of U.S. application Ser. No. 17/406,924, filed Aug. 19, 2021, which application claims the benefit of U.S. Provisional Application No. 63/068,958, filed Aug. 21, 2020, all of which is incorporated by reference in their entirety.

BACKGROUND

Three dimensional integrated circuits (3DICs) are designed using a multi-die packaging technique that stacks multiple dice together to form a single system. Such a system often contains multiple memory dice and multiple logic dice such as central processing units (CPUs) and graphic processing units (GPUs). The signal communication between two neighboring dice that physically touch each other or are jointed together by solder balls, which are called bumps, occurs through inter-die contacts, such as direct metal-to-metal bondings, or bumps. The signal communication between other non-neighboring dice may go through a third die. If a die is solely designed as a communication channel between other dice, the die is called interposer. The routing of an interposer connects bumps of each net without routing rule violations.

One common type of interface implemented on the interposer of a 3DIC system is the high-bandwidth memory (HBM) channel between memory and processor dice. A single HBM channel connects the interface circuit, called physical layer (PHY), of a memory chip to the PHY of a logic chip. On the interposer die, the PHYs of memory and logic chip have a corresponding bump array each. The signal routing of the HBM channel on the interposer connects the bumps of the two bump arrays using interconnects.

HBM design is a fast-evolving area because of the ever-increasing demand for IC systems with high memory throughputs in areas such as artificial intelligence and high-performance graphics. The clock frequency of HBM channels has reached several giga-hertz and is expected to increase even further. Furthermore, the width of HBM channels, measured as the number of nets to be routed, increases so that more data can be transferred in parallel. The combination of the high frequency requirement and the large count of nets makes HBM routing a challenging problem. Nevertheless, the number of HBM channels in a 3DIC system is increasing.

The signal routing of HBM channels is particularly challenging due to several reasons. First, combination of the high operating frequency and long interconnect length demands wide interconnects to reduce routing net resistance. In fact, almost 100% of the routing area is utilized for routing. Second, the demand of high signal integrity and noise tolerance may limit routing to single-layer routing. The elimination of vias can reduce signal reflection and routing net resistance. The need to reduce vias does not allow frequently switching layers, further increasing the routing difficulty. Thirdly, multiple nets of an HBM channel are used to transmit different bits of a single address and data. Thus, the corresponding routing lengths may need to match each other to achieve similar timing delays. Due to the aforementioned routing requirements, auto-routing of HBM channels cannot be resolved by existing conventional signal routers.

An interposer with multiple HBM channels likely includes other nets not part of any HBM channel. Therefore, when users apply an HBM router to the HBM channels, they need to specify which portion or portions of the interposer design are the HBM channels. The manual specification of several thousands of nets of HBM channels for routing is not only tedious but also error-prone. Moreover, different HBM channels have different configurations such as net counts, bump placements, and routing rules. Some HBM channels even deviate from HBM channel standard descriptions. Users need to provide information of these unique channel characteristics to the HBM router to produce high-quality routing results. The collection of such information to set HBM router parameters is another hurdle to route HBM channels.

SUMMARY

Methods and systems are described herein relate to automatic channel identification of memory channels (e.g., high-bandwidth memory channels) and subchannel generation. In one non-limiting example, a method includes identifying candidate nets within a netlist. A bounding box that includes one or more nets of the candidate nets is determined. Once the bounding box is determined, the orientation of the box is determined and used to determine a pattern of bumps within the bounding box. Finally, a subchannel is generated based on the pattern of bumps.

Each net of the candidate nets may share a minimal net span value with at least a threshold number of other nets of the candidate nets. To identify the candidate nets within the netlist, a first histogram of horizontal net span values and a second histogram of vertical net span values may be determined. The method may then proceed to determine whether a net belongs to a bin in at least one of the first or second histograms having a center value that meets a minimal net span value and at least a threshold number of nets of the candidate nets. If a net belongs to a bin, the net is determined to be a candidate net. The bounding box may be a first bounding box and determining the first bounding box that includes the one or more nets may include determining whether two or more bounding boxes overlap and if they overlap, merging the two or more bounding boxes into the first bounding box (i.e., the merged box is the first bounding box).

The method may further include determining whether a gap is present between a first group of bumps and a second group of bumps within the bounding box. If the gap is present, the HBM channel associated with the bounding box is identified. To determine whether a gap is present between two groups of bumps within the bounding box, an analysis of bump locations of nets may be performed. The quantity of candidate nets within a bounding box may be at least a threshold number of nets. For each of the candidate nets, a horizontal net span of the net may be determined. The gap may be determined to be present based on the horizontal net spans of the nets. Additionally or alternatively, vertical net spans of the candidate nets may be used to determine the gap is present.

In some embodiments, the orientation of the bounding box is a horizontal orientation. A bounding box with a horizontal orientation may be associated with a gap having a vertical orientation. If both a vertical and horizontal gap is determined to be present, the orientation may be determined using a bump array dimension, which includes a bump row size and a bump column size. If the bump column size is smaller than the bump row size, the orientation of the HBM channel is determined to be horizontal. If the bump row size is smaller than the bump column size, the orientation of the HBM channel is determined to be vertical. Each group of bumps separated by the gap may be processed in the same way. For example, the left group of two groups of bumps separated by a vertical gap may be processed to determine a pattern among the bumps within the left group and then the right group of the two groups may be processed similarly to determine a pattern among the bumps within the right group.

Determining the pattern of bumps within a group of bumps within a horizontal bounding box (i.e., a bounding box having a horizontal orientation) may include determining vertical and horizontal coordinates of the bumps within the group and determining the pattern of bumps based on shared vertical coordinates between bumps of a first horizontal coordinate and bumps of a second horizontal coordinate. Alternatively, the orientation of the bounding box may be a vertical orientation associated with a gap having a horizontal orientation. Determining the pattern of bumps within a group of bumps in a vertical bounding box may include determining horizontal and vertical coordinates of respective bumps within the group and the pattern of those bumps based on shared horizontal coordinates between bumps of a first vertical coordinate and bumps of a second vertical coordinate.

Phantom bumps may be added to rows or columns of bumps in a bump array to reduce the total number of detected patterns. Three patterns of bumps may be determined to be included within a bump array. A set of bumps (e.g., a row of bumps within the array) having a third pattern may be modified by adding a phantom bump. The modified set of bumps may then have the second pattern of bumps. A subchannel can be generated using the bump array having the first and second pattern of bumps (e.g., without the third pattern of bumps).

In some embodiments, creating the subchannel based on the pattern of bumps includes determining that the pattern of bumps is present in a first subchannel bounding box and in a second subchannel bounding box. A bounding box of an HBM channel may include one or more subchannel bounding boxes. The first subchannel bounding box may be located at a first end of the HBM channel and the second subchannel bounding box may be located at a second end of the HBM channel. The first and second subchannel bounding boxes may be identified within the HBM channel based on the common pattern of bumps at either end of the HBM channel. The subchannel is created that includes the first subchannel bounding box and the second subchannel bounding box.

In one non-limiting example, a system comprises a memory storing instructions and a processor coupled with the memory and to execute the instructions. The instructions, when executed, cause the processor to identify candidate nets within a netlist, determine a bounding box that includes one or more nets of the candidate nets, determine an orientation of an HBM channel associated with the bounding box, determine a pattern of bumps within the bounding box based on the orientation, and create a subchannel based on the pattern of bumps.

In another non-limiting example, a system comprises a channel dimension prediction module configured to identify candidate nets within a netlist, a channel bounding box prediction module configured to determine a bounding box that includes one or more nets of the candidate nets, a channel orientation derivation module configured to determine an orientation of an HBM channel associated with the bounding box, a subchannel partition module configured to determine a pattern of bumps within the bounding box based on the orientation, and a subchannel routing region creation module configured to create a subchannel based on the pattern of bumps.

In some embodiments, a non-transitory computer readable medium comprises stored instructions, which when executed by a processor, cause the processor to identify candidate nets within a netlist, determine a bounding box that includes one or more nets of the candidate nets, determine an orientation of an HBM channel associated with the bounding box, determine a pattern of bumps within the bounding box based on the orientation, and create a subchannel based on the pattern of bumps.

BRIEF DESCRIPTION OF THE FIGURES

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

Figure (FIG. 1 is a block diagram illustrating a process for identifying HBM channels, according to at least one embodiment.

DETAILED DESCRIPTION

Aspects of the present disclosure relate to automatic channel identification of high-bandwidth memory channels for auto-routing.

The systems and methods herein for HBM channel identification addresses the problem of automatic identification of one or more HBM channels in a given netlist of an interposer. For each HBM channel identified, an HBM channel identification system can derive the characteristics of the channel, including the channel orientation, channel location, the patterns of bump arrays of the channel, and whether the channel deviates from an HBM channel standard. The system can compute parameter settings and derive guidance for an HBM auto-routing tool.

The HBM channel identification system may perform a set of operations (e.g., five operations) sequentially to identify HBM channels within the netlist of an interposer. The five operations in one example embodiment are channel dimension prediction, channel bounding box prediction, channel orientation derivation, subchannel partition, and subchannel routing region creation. When the components are sequentially performed and an operation fails, an error can be reported after failing to perform the operation. The system may prompt users to modify an interposer netlist provided to the system. The modified netlist is then processed from the beginning of the sequence of operations. If all five operations succeed, one or more HBM channels are detected. The system computes the characteristics of the HBM channels. The channel characteristics can be used to generate routing guidance and settings of an HBM channel router, which completes the routing of the HBM channels.

The benefit of disclosed configuration is at least threefold. First, the HBM channel identification system improves the ease-of-use of HBM auto-routing tool. With the automatic identification of HBM channels, users do not need to manually collect HBM channel information for HBM auto-routing tools. Second, the system can improve the HBM routing quality-of-result (QoR). The disclosed configuration automatically computes the optimal settings of the HBM router and routing guidance that helps a router derive an optimal routing result and reduce routing time. Third, the system checks the HBM channel designs for potential user design errors. A deviation of the identified HBM channels from an HBM standard can be reported to designers for verification.

HBM Channel Identification Overview

Figure 1:
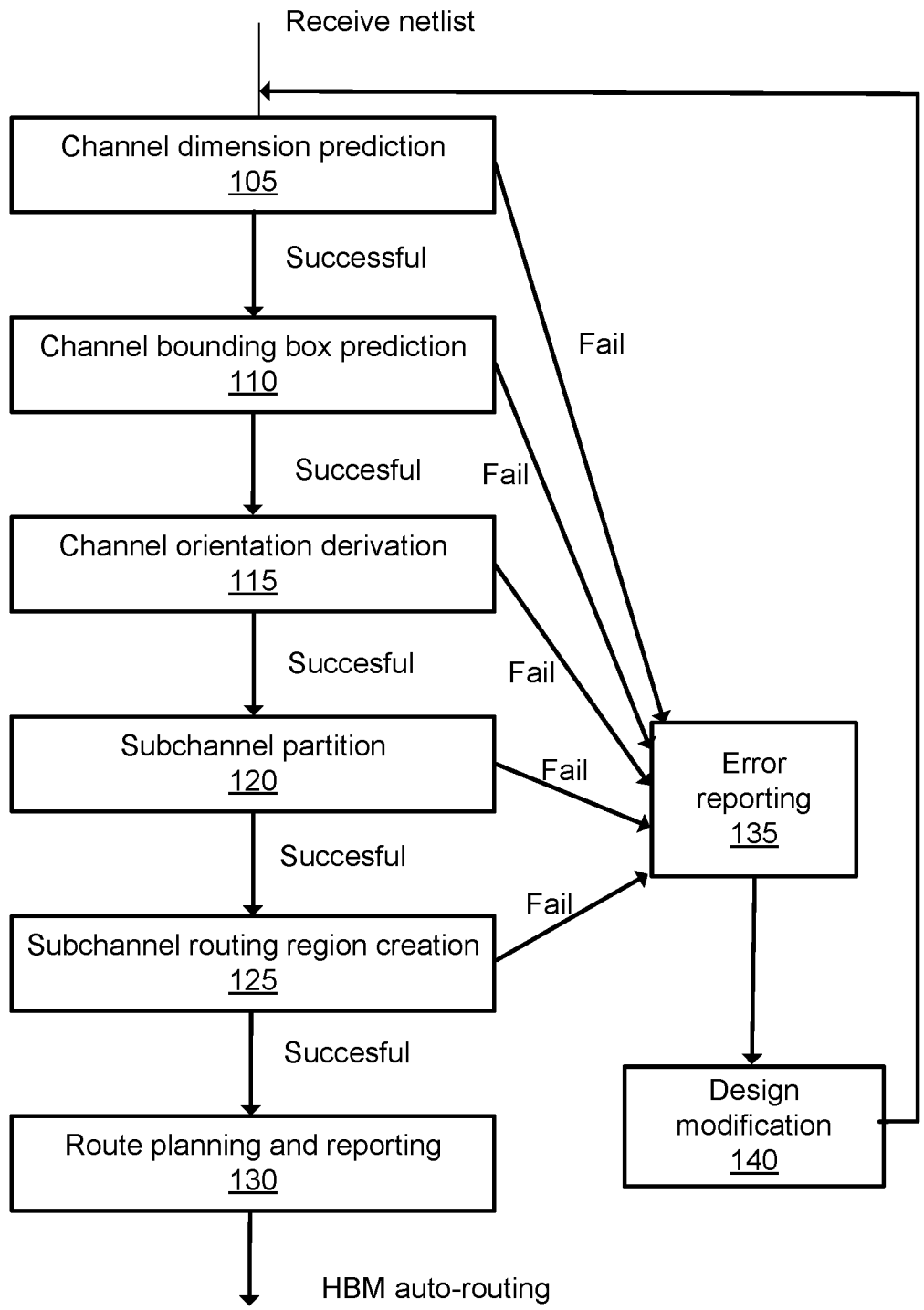

FIG. 1 is a block diagram illustrating process 100 for identifying HBM channels, according to at least one embodiment. An HBM channel identification system may automatically identify an HBM channel, determine HBM subchannels for HBM auto-routing, and report errors flagged during the aforementioned identification and determination. The HBM channel identification system may be a tool within an EDA process, an example of which is provided in the description of FIG. 12. The HBM channel identification system may be used to design a 3DIC that can be emulated in an example emulation environment as described in FIG. 13.

The HBM channel identification system may receive a netlist of an interposer die as provided by a user or from a third-party EDA tool. The system may be hosted and executed on a remote server that is communicatively coupled to a computing device from which inputs such as the netlist are received. Alternatively or additionally, the system may be hosted and executed locally by a computing device whose interface is leveraged by the user to provide the netlist for automatic HBM channel identification. An example computing device is further described in the description of FIG. 14.

Since an interposer die may have various nets, including those that describe an HBM channel (e.g., various signal-carrying traces in a netlist), the system identifies which portions of an interposer design are the HBM channels. The system predicts 105 channel dimension and predicts 110 a channel bounding box to identify the likely presence of an HBM channel in an interposer die. If the system is unable to predict 105 a channel dimension or predict 110 a channel bounding box, the system may report 135 an error to the user. To predict 105 channel dimension, the system identifies candidate nets within the received netlist, where the candidate nets are potentially nets of an HBM channel. The system then predicts 105 the HBM channel dimension using the identified candidate nets.

The HBM channel identification system may perform HBM auto-routing. The system computes optimal settings of an HBM router to derive best routing results and reduce routing time, where the optimal settings include subchannels of the identified HBM channel. To compute subchannels from the HBM channel, the system derives 115 the HBM channel's orientation, partitions 120 the HBM channel into subchannels based on the derived orientation, and creates 125 subchannel routing regions using the partitioned HBM subchannels. If the system detects errors while computing subchannels, the system may report 135 the error to the user. For example, the system may be unable to determine an orientation of the HBM channel because there is no identifiable gap between clusters of bumps in a bounding box of candidate nets, and the system may report 135 the lack of gap.

After reporting 135 the error, the system may generate a user interface element enabling the user to modify 140 the design of the 3DIC. When the user has modified 140 the design, the user may provide the modified netlist to the system, which returns to predicting 105 a dimension of a potential HBM channel to identify the HBM channel within the modified netlist. If the system does not detect any errors while identifying the HBM channel or computing subchannels, the system computes characteristics of the one or more HBM channels identified, which can be used to generate routing guidance and settings of an HBM channel router. Optionally, the system can also report the computed characteristics, routing guidance, or settings. These operations performed after detecting a lack of errors in the 3DIC design fall under the route planning and reporting 130. Finally, the system may provide the routing guidance and settings of the HBM channel router to an auto-routing tool to establish a layout of the interposer die or the 3DIC design including the interposer die. In some embodiments, the system may perform the auto-routing. The operations in process 100 in FIG. 1 are further described in the descriptions of FIGS. 2-11.

Channel Dimension Prediction Using Net Length Analysis

In channel dimension prediction 105 of FIG. 1, an HBM channel identification system predicts an HBM channel dimension. To determine a likely dimension, the system identifies nets within a received interposer netlist that may be HBM channel nets. The system identifies likely HBM channel nets by analyzing dimensions of 2-pin nets in the netlist and predicts an HBM channel dimension using candidate 2-pin nets that qualify as HBM channel nets based on their dimensions. The analysis of dimensions may be referred to herein as "net length analysis" and is described in the description of FIGS. 2-4.

Figure 2:
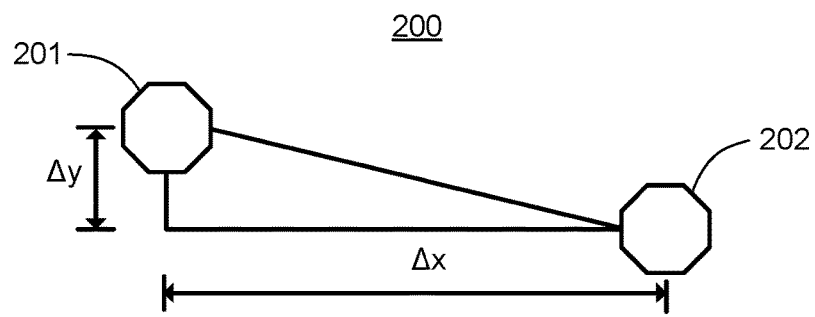
FIG. 2 depicts a flyline span of a two-pin net between two bumps, according to at least one embodiment.

FIG. 2 depicts a flyline span 200 of a two-pin net between bumps 201 and 202, according to at least one embodiment. The HBM channel identification system may identify a pair of two bumps 201 and 202 connected as a 2-pin net of a received netlist. An HBM channel dimension can be derived based on a spanning dimension of the 2-pin net between bumps 201 and 202. The spanning dimension, which may also be referred to as the "two-dimensional span," includes a horizontal span value and a vertical span value. The horizontal span value may be the difference between the x-coordinate values of bumps 201 and 202. The vertical span value may be the difference between the y-coordinate values of bumps 201 and 202. Since the flylines of nets in an HBM channel can be similar due to the regular bump patterns of an HBM channel, the system may use the spanning dimensions to predict the HBM channel's dimension. In some embodiments, although flylines of individual nets might have slightly different lengths or orientations, an HBM channel may contain a set of 2-pin nets with statistical similarity. The system can analyze each 2-pin net of the interposer in the netlist. For each net, the two-dimensional span values are calculated as in FIG. 2, which shows flyline span 200 of a two-pin net between two bumps 201 and 202.

Figure 3:
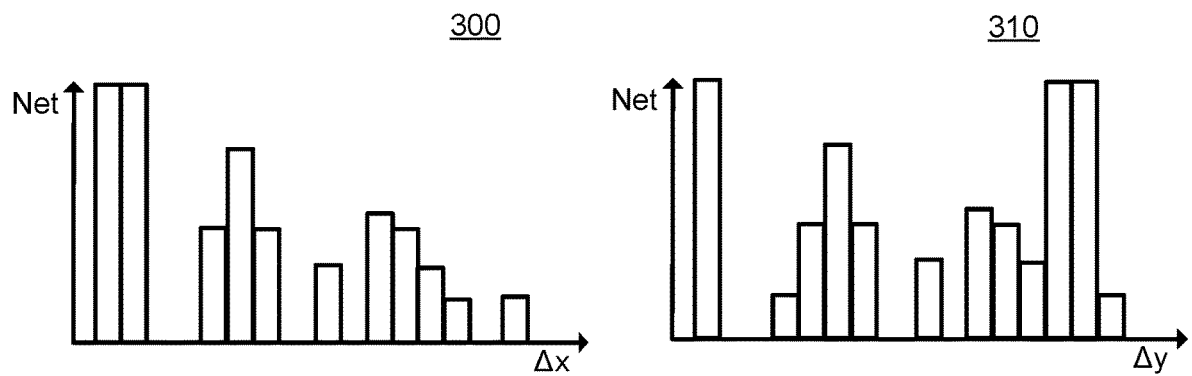
FIG. 3 depicts histograms of net span values, according to at least one embodiment.

FIG. 3 depicts histograms 300 and 310 of net span values, according to at least one embodiment. The HBM channel identification system identifies potential nets of an HBM channel of the interposer using histograms. The HBM channel identification system may determine the two-dimensional span values of each net within a netlist for an interposer and create histograms of the two-dimensional span values. Histograms 300 and 301 of net span values are created by the system for horizontal span values and vertical span values, respectively. The range of the histogram may start from the minimal value (e.g., according to the design of the interposer) and end at the largest value of the design. The system may derive bin widths such that the center values of adjacent bins have a small deviation (e.g., 2% deviation).

Figure 4:
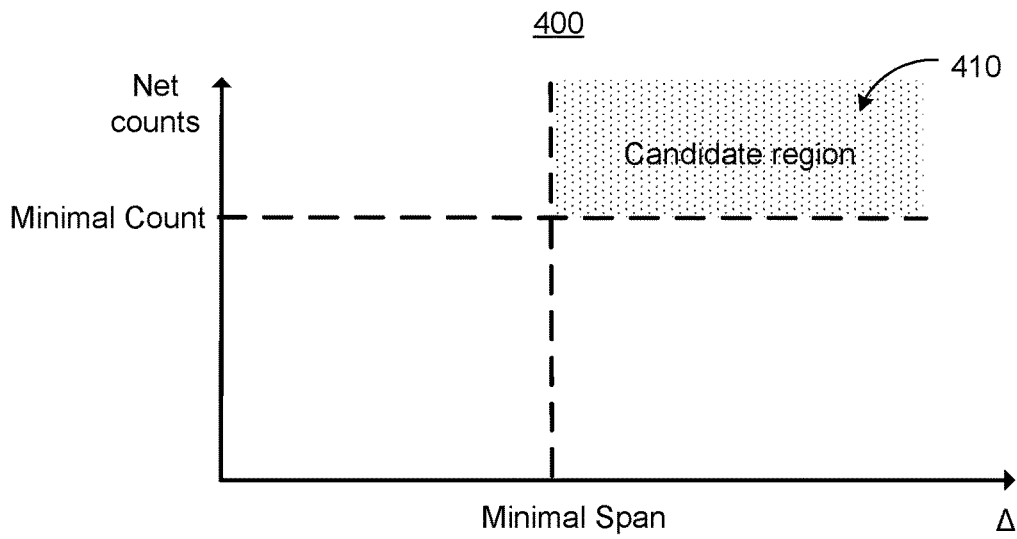
FIG. 4 depicts a graph for determining a candidate region of potential HBM nets, according to at least one embodiment.

FIG. 4 depicts graph 400 for determining candidate region 410 of potential HBM nets, according to at least one embodiment. The HBM channel identification system determines a candidate region based on a minimal span value and a minimal net count value. The minimal span value may be derived from circuit fabrication technology standards. For example, circuit fabrication technology such as 3 nm process or 5 nm process may be used to determine a minimal span value, which can be a predefined proportion of a size of an array of bumps (e.g., 20% of the array size). Alternatively, a user may specify a minimal span value to the system. The minimal span value may apply to either or both of the horizontal span value and the vertical span value. The minimal net count can be defined by an HBM channel standard. For example, a minimal net count of 1000 is used for the HBM2e standard.

The system determines which nets in at least one of histograms 300 and 310 of net span values fall within candidate region 410 to identify potential nets of an HBM channel. For example, a bar in the histogram may contain a number of candidate nets exceeding the minimal count and each candidate nets within the bar have a span exceeding the minimal span. Accordingly, nets within the bar fall within candidate region 410. Furthermore, each net of the candidate nets may share a minimal net span value with at least a threshold number of other nets of the candidate nets. By determining which nets in a received netlist fall within candidate region 410, the system can determine whether the received netlist includes at least one HBM channel. The nets that fall within candidate region 410 are used to predict the HBM channel dimension. The system may use the two-dimensional span values of the nets that belong to candidate region 410 to predict the HBM channel dimension. For example, the system may use the largest horizontal and vertical span values as the predicted HBM channel dimension.

HBM Channel Bounding Box Prediction

Figure 5:
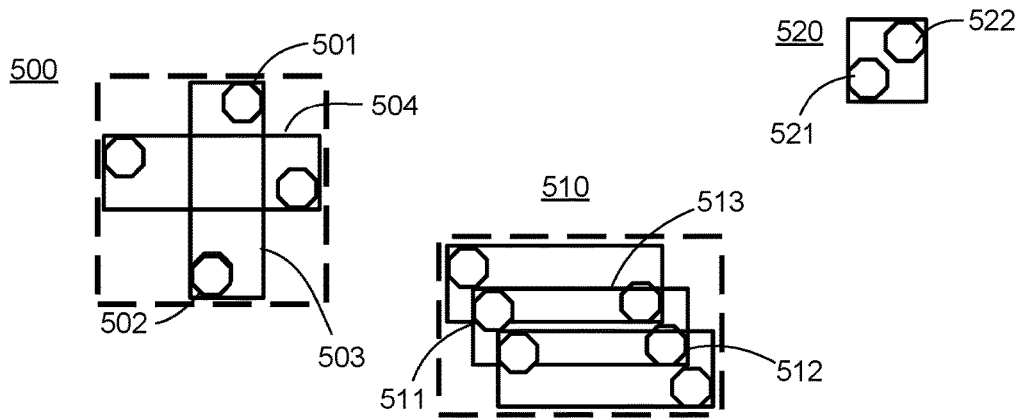
FIG. 5 depicts construction of HBM channel bounding boxes, according to at least one embodiment.

FIG. 5 depicts construction of HBM channel bounding boxes 500, 510, and 520, according to at least one embodiment. In channel bounding box prediction 110 of FIG. 1, an HBM channel identification system constructs HBM channel boxes after determining candidate nets. In some embodiments, the system creates a bounding box for each candidate net. If any two bounding boxes overlap, the system merges the bounding boxes into a channel bounding box, which may also be referred to herein as a "cluster box," containing both boxes. For example, the system creates bounding box 503 for bumps 501 and 502 of a 2-pin net and bounding box 504 for another pair of bumps of a 2-pin net. The system determines that bounding boxes 503 and 504 overlap and constructs channel bounding box 500 that includes overlapping boxes 503 and 504. The system may continue to identify bounding boxes for candidate nets and merge the bounding boxes into channel bounding boxes until no two candidate net bounding boxes overlap. For example, the system continues to merge candidate net bounding boxes and produces channel bounding boxes 510 and 520 in addition to box 500. Channel bounding box 510 includes three 2-pin nets whose bounding boxes overlap, including bounding box 513 having bumps 511 and 512. To create channel bounding box 520, the system determines a bounding box for the bumps 521 and 522, determines that no other candidate net bounding box overlaps with the bounding box of bumps 521 and 522, and determines that channel bounding box 520 is the same as the candidate net bounding box. Each cluster box can be a bounding box for a potential HBM channel.

HBM Channel Orientation Derivation

Figure 6:
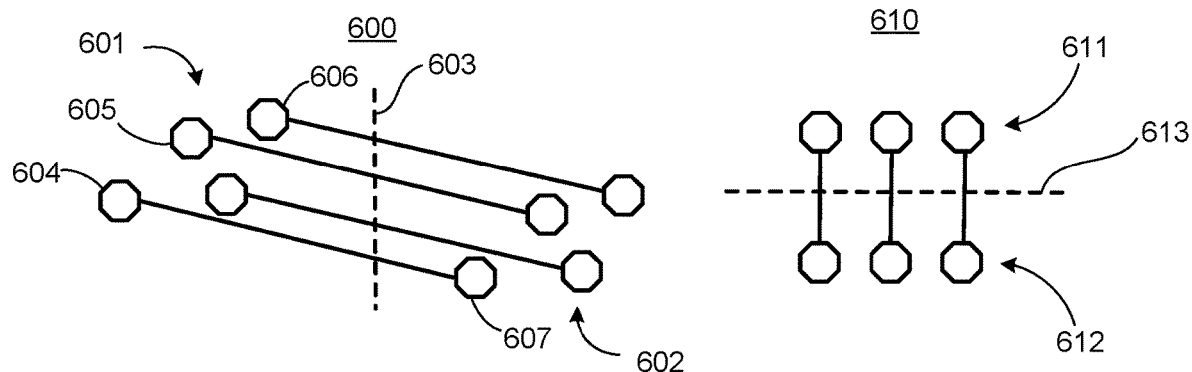
FIG. 6 depicts gap identification for HBM channels, according to at least one embodiment.

FIG. 6 depicts gap identification for cluster boxes 600 and 610, according to at least one embodiment. In channel orientation derivation 115 of FIG. 1, an HBM channel identification system may analyze each constructed cluster box to determine whether the cluster box contains an HBM channel. The system may compare the number of nets within a cluster box to a threshold number of nets. If a given cluster box does not contain enough nets, the system may determine to skip the channel orientation derivation for the cluster box. Otherwise, the system uses bump placement information to determine whether a gap is present in the cluster box and the orientation of the HBM channel represented by the cluster box.

The HBM channel identification system can examine the two bumps of each net to determine whether a gap exists between the two bumps of each net. The gap can be either a horizontal or vertical line (e.g., imaginary line) such as lines 603 and 613, which indicate gaps in cluster boxes 600 and 610, respectively. If the system determines there is no gap, the cluster box is skipped and the system determines there is likely no HBM channel inside the cluster box.

In some embodiments, the HBM channel identification system determines whether a gap is present between two groups of bumps in a cluster box based on edges of the nets within the box. The system determines that the number of nets in the cluster box meets a threshold number of nets and determines two edges of each net in the cluster box. The edges may be determined using the bump placement information (e.g., coordinates at which each bump is located). In one example, an first edge of a net may be characterized by a first bump's x-coordinate and the second edge of the net may be characterized by the second bump's x-coordinate. The system may determine bounding boxes of bump groups 601 and 602, which contain the smaller x-coordinate edges of all nets and larger x-coordinate edges of all nets, respectively. Accordingly, the system may determine that there exists a vertical gap, indicated by line 603, between bump groups 601 and 602 of cluster box 600.

In some embodiments, a first edge of a net may be characterized by a first bump's y-coordinate and the second edge of the net may be characterized by the second bump's y-coordinate. The system may determine bounding boxes of bump groups 611 and 612, which contain the smaller y-coordinate edges of all nets and larger y-coordinate edges of all nets, respectively. Accordingly, the system may determine that there exists a horizontal gap, indicated by line 613, between bump groups 611 and 612 of cluster box 610.

The orientation of the HBM channel in a cluster box is determined using the gap. The HBM channel identification system may determine that the orientation of the HBM channel is a horizontal orientation if the gap is vertical (e.g., line 603). The system may determine that the orientation of the HBM channel is a vertical orientation if the gap is horizontal (e.g., line 613). The HBM channel identification system may determine that both vertical and horizontal gaps exist in a cluster box. To determine whether the HBM channel of the cluster box is oriented vertically or horizontally, the system may use a bump row size and a bump column size. If a gap is both vertical and horizontal, the system determines a bump array dimension that includes a bump row size and a bump column size. Bump placement information may be in a row and column configuration, where the x and y coordinates of each bump (e.g., the center coordinate of a bump) correspond to a row and column that the bump is located. The bump row size, when both vertical and horizontal gaps exist, may be a number of rows that the bumps in a cluster box occupy. The bump column size, when both vertical and horizontal gaps exist, may be a number of columns that the bumps in the cluster box occupy. For example, the bumps of cluster box 610 may occupy 2 rows and 3 columns. The system may determine that the orientation of the HBM channel of a cluster box is a horizontal orientation if the bump column size is smaller than the bump row size. The system may determine that the orientation of the HBM channel of a cluster box is a vertical orientation if the bump row size is smaller than the bump column size.

Subchannel Partition

Figure 7:
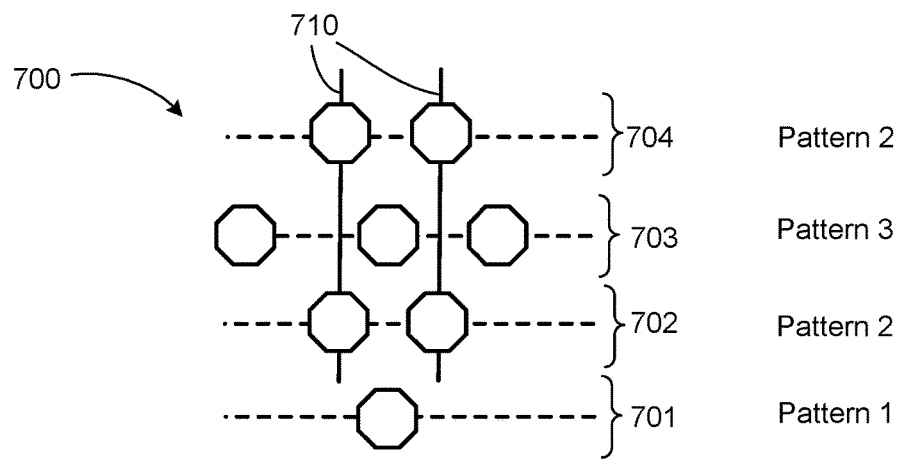
FIG. 7 depicts bump row and row pattern identification, according to at least one embodiment.

FIG. 7 depicts bump row and row pattern identification, according to at least one embodiment. In subchannel partition 120 of FIG. 1, an HBM identification system performs bump pattern analysis to extract the HBM characteristics and derive HBM subchannels after the HBM channel orientation is derived. The bump row and column pattern may be derived first for the two groups of bumps at the two ends of the HBM channel. The system may process both groups separately and in the same way. The system can group bumps connected to 2-pin nets based on the coordinates perpendicular to the channel orientation. In this way, the system determines a pattern of bumps within a channel bounding box based on the orientation of the HBM channel. FIG. 7 shows bump array 700 of a horizontal HBM channel. Bumps with the same vertical coordinate form a single row. For example, row 701 includes a single bump because no other bump shares a vertical coordinate (e.g., y-coordinate) with it. Row 702 contains two bumps that share a vertical coordinate. Similarly, rows 703 and 704 are formed of bumps that have the same respective vertical coordinates. The "pattern" of a row refers to the horizontal coordinates (e.g., x-coordinates) of bumps in the same row. For example, rows 702 and 704 have the same pattern, Pattern 2 as characterized by the x-coordinates of lines 710, and rows 701 and 703 have Patterns 1 and 3, respectively. There are three patterns among bumps in array 700.

Figure 8:
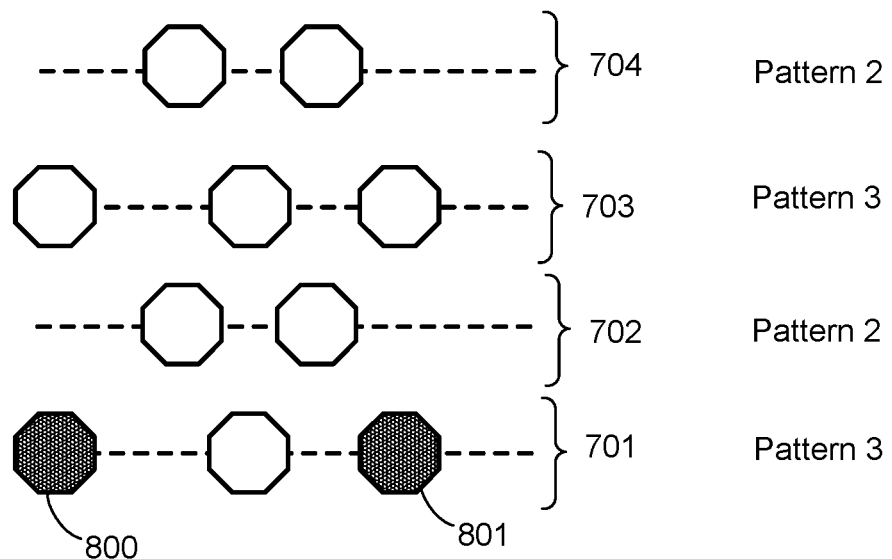
FIG. 8 depicts a reduction of smaller patterns by adding phantom bumps, according to at least one embodiment.

FIG. 8 depicts a reduction of smaller patterns by adding phantom bumps 800 and 801, according to at least one embodiment. Bumps can be placed into arrays, which an HBM channel identification system divides into subchannels. In some embodiments, all subchannels have the same patterns for bumps. If a user provides a netlist with randomly placed bumps, there not be a discernable pattern of bumps. If there is one pattern, the system can determine that each row or column, depending on the orientation of the HBM channel, can become its own subchannel because each row or column has the same pattern. If there are two patterns, the system can determine that each subchannel contains a certain number of, for example, rows of Pattern 1 and a certain number of rows of Pattern 2. The more types of patterns within an array, the more processing may be needed to divide the array into subchannels. By adding phantom bumps, the number of patterns may be reduced and generating subchannels may require less processing.

The HBM channel identification system performs pattern reduction operations to simplify bump arrays. Specifically, a first pattern (e.g., pattern B) is contained in a second pattern (e.g., pattern A) if pattern A includes all bump coordinates of pattern B but not vice versa. For example, pattern 1 is contained in pattern 3 in FIG. 7. The system processes a bump row whose pattern is inside another pattern by including other bumps that already exist inside the cluster bounding box but are not part of the set of bumps with 2-pin nets. Additionally, phantom bumps can be added so that the pattern contained becomes identical to the container pattern. For example, phantom bumps 800 and 801 are added to the bump in row 701 to modify Pattern 1 into Pattern 3. These new bumps can be used to reduce the number of different patterns and therefore, simplify the bump array.

Figure 9:
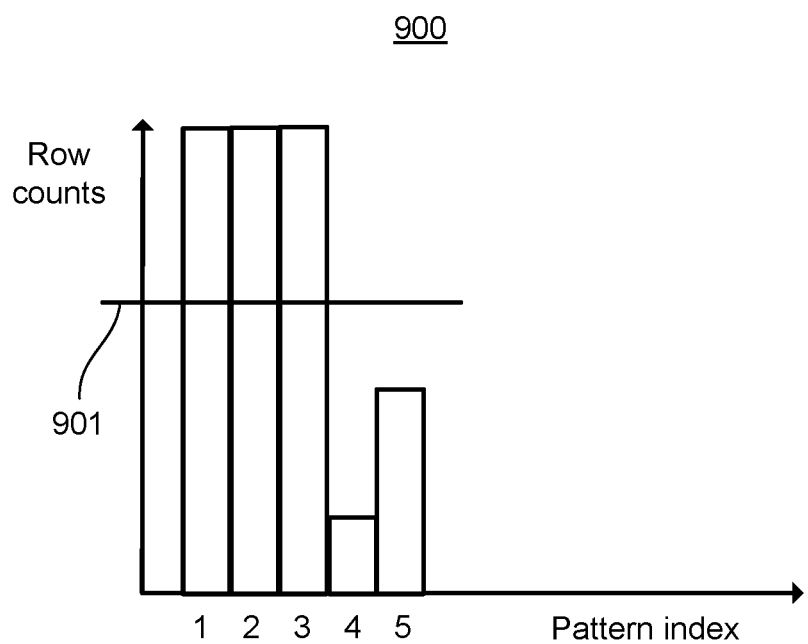
FIG. 9 depicts a histogram of bump rows created based on patterns, according to at least one embodiment.

FIG. 9 depicts histogram 900 of bump rows created based on patterns, according to at least one embodiment. An HBM channel identification system may create a histogram of patterns after eliminating patterns contained by other patterns (e.g., modifying Pattern 1 of FIGS. 7-8, which was included in Pattern 3, into Pattern 3). Patterns that appear many times (e.g., more than 30 times) may be called "popular patterns." Histogram 900 shows a name or index of a pattern at the x-axis and a number of appearances of each pattern in the rows of bumps (i.e., of an HBM channel with a horizontal orientation) in the y-axis. For a vertical HBM channel orientation, the y-axis may show the number of appearance of each pattern in a column of bumps.

Histogram 900 includes pattern count threshold 901 corresponding to the minimum frequency to qualify as a "popular pattern." For example, threshold 901 may be 30. In some embodiments, popular patterns are considered for HBM routing (e.g., the system exclusively considers popular patterns). Accordingly, Patterns 4 and 5 of histogram 900 may not be considered for HBM routing. Patterns that are not popular might be due to design errors. Accordingly, the HBM channel identification system may generate a notification to a user that there are patterns other than popular patterns, where the notification includes a prompt to verify the correctness of the bumps of the patterns other than popular patterns. For example, the system may generate a notification for display on a computing device of a user prompting the user to verify the correctness of bumps having Patterns 4 or 5. Verifying the correctness of bumps may require assessment of bump misalignment, bump size deviation, bump reference cell deviation, whether there are nets connecting more than 2 pins, or whether there are any pre-routes or vias in the bump array region that do not belong to any HBM net.

Figure 10:
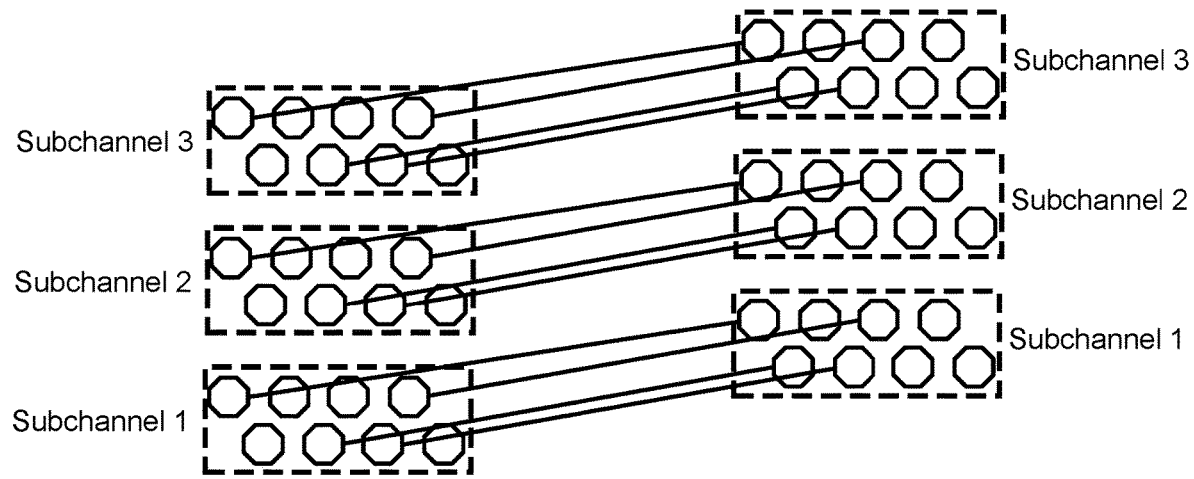
FIG. 10 depicts a partition of an HBM channel to create subchannels, according to at least one embodiment.

FIG. 10 depicts a partition of an HBM channel to create subchannels, according to at least one embodiment. An HBM subchannel may be defined as a fraction of an HBM channel. Each 2-pin net may be fully contained within a single subchannel. Subchannels may be non-overlapping. Therefore, the system may route subchannels independently. The system may create subchannels by examining bump rows or columns at both ends of an HBM channel. FIG. 10 illustrates the partition of a horizontal HBM channel into multiple subchannels (i.e., subchannels 1-3). As depicted in FIG. 10, not all pairs of bumps on either side of the HBM subchannels are connected to promote clarity of the figure, but it will be understood by a person having ordinary skill in the art that the pairs of bumps may have connections between them. The system examines bump rows on either side of the HBM subchannels and derives corresponding nets. The minimal numbers of rows with the same set of nets can be considered a single subchannel. As an option, a subchannel can have the same number of bump rows with various patterns. A user can specify to the system a lower bound of bump counts for each subchannel to limit the total number of subchannels.

Subchannel Routing Region Creation

Figure 11:
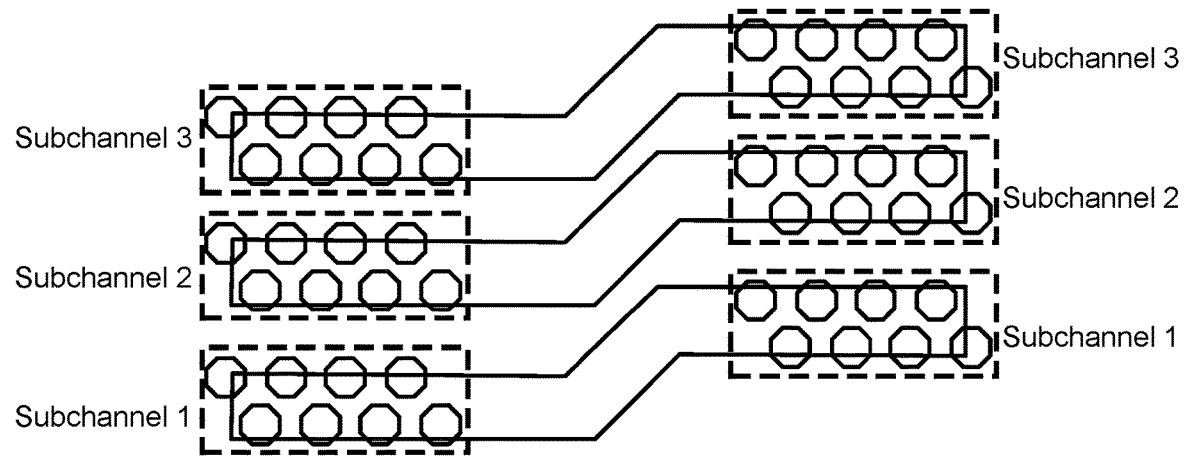
FIG. 11 depicts routing regions for HBM subchannels, according to at least one embodiment.

FIG. 11 depicts routing regions for HBM subchannels, according to at least one embodiment. In subchannel routing region creation 125 of FIG. 1, an HBM identification system creates a routing region for each subchannel once the subchannels are partitioned (i.e., created). The system may perform auto-routing inside each subchannel (e.g., in its own routing region). The routing regions may not overlap with each other. Therefore, the system can perform or a third-party automated routing tool may perform parallel routing to reduce the overall routing time. A challenge in creating routing regions in existing systems can be ensuring that a subchannel is routable inside of the region while maintaining non-overlapping property among all regions at the same time. The HBM channel identification system addresses this problem by enabling the regions to be non-overlapping. FIG. 11 shows an example in which the computation of the water-fall locations is needed. That is, the computation includes the partition of the middle section of the HBM channel between the opposing groups of bumps.

Error Reporting and HBM Characteristics Extraction

In each of the operations of the HBM channel identification, if any error is encountered, the HBM channel identification system may report the error to a user so that a corresponding design error can be corrected. After an HBM channel is detected, the system can report any deviation of the HBM channel being detected from the HBM channel standard description. For example, the system can collect all bumps in the bounding box of a bump array of a subchannel with their correspond nets. If the system determines that a net does not cross the HBM channel, the net can be reported to the user (e.g., via a computing device of the user). If the system determines that a net connects pins outside of the HBM channel, the system may also report this net to the user. In addition, the system can report the following issues: bump misalignment, bump size deviation, bump reference cell deviation, the presence of any net connecting more than 2 pins, and the presence of any pre-routes or vias in the bump array region that do not belong to any HBM nets.

After the identification of HBM channels and creation of subchannels, the HBM channel identification system can perform route planning at route planning and reporting 130 of FIG. 1. Specifically, the system can extract characteristics of HBM channels, such as bump array patterns, and use the extracted characteristics to reconfigure and guide HBM routers during an automated routing procedure. The routing regions of subchannels can be used as route guides to realize parallel routing to increase routing speed and improve routing quality.

Example EDA Process for Design of Disclosed HBM Channels

Figure 12:
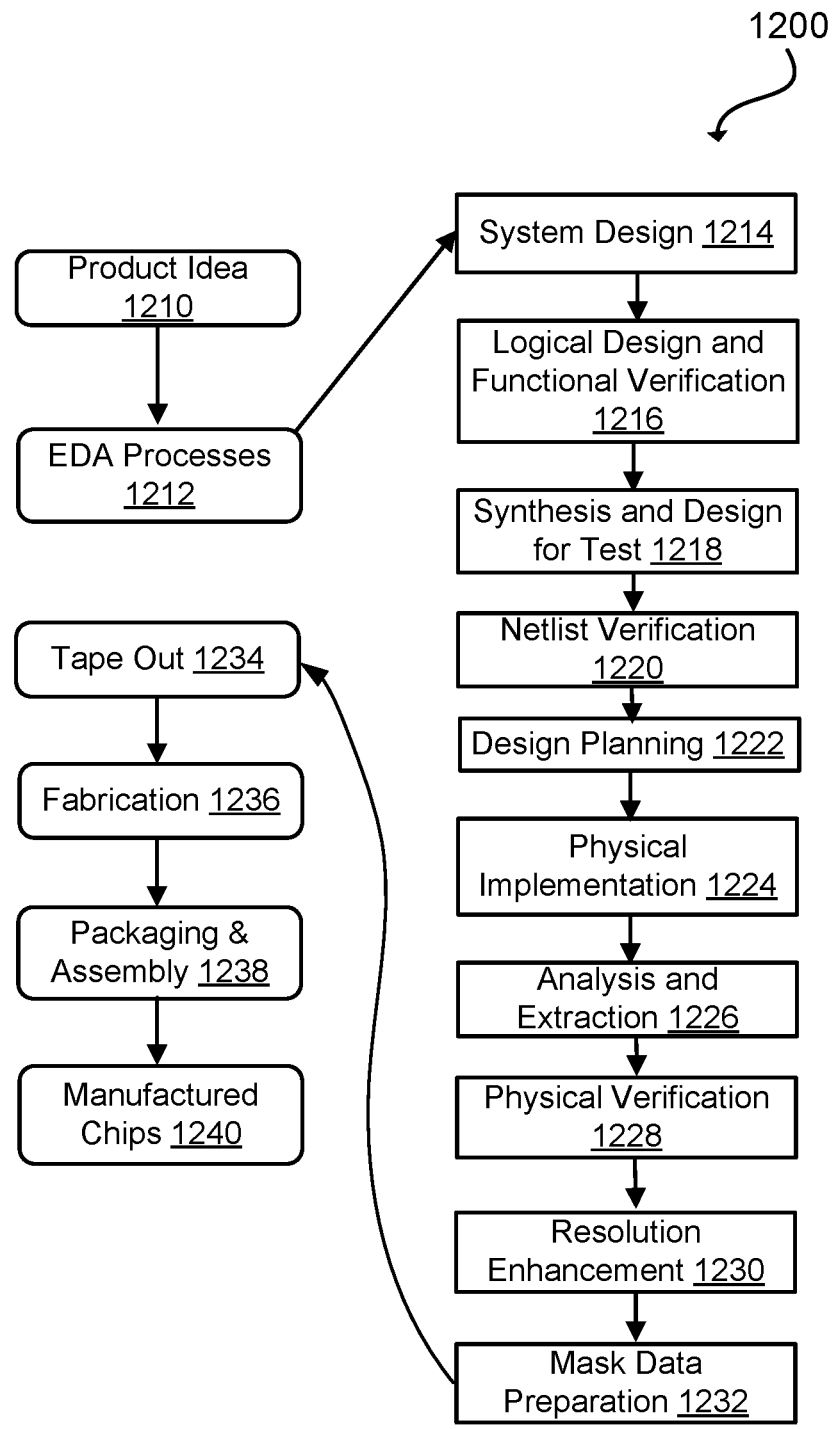
FIG. 12 depicts a flowchart of various processes used during the design and manufacture of an integrated circuit in accordance with some embodiments of the present disclosure.

The disclosed circuit configurations may be instantiated using software tools that enable design of the circuit, verification of its operation, and ultimately manufacture of the circuit. FIG. 12 illustrates an example set of processes 1200 for software tools used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1210 with information supplied by a designer, information which is transformed to create an article of manufacture that uses a set of EDA processes 1212. When the design is finalized, the design is taped-out 1234, which is when artwork (e.g., geometric patterns) for the integrated circuit is sent to a fabrication facility to manufacture the mask set, which is then used to manufacture the integrated circuit. After tape-out, a semiconductor die is fabricated 1236 and packaging and assembly processes 1238 are performed to produce the finished integrated circuit 1240.

Specifications for a circuit or electronic structure may range from low-level transistor material layouts to high-level description languages. A high-level of abstraction may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 12. The processes described may be enabled by EDA products (or tools).

During system design 1214, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1216, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1218, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1220, the netlist is checked for compliance with timing constraints and for correspondence with the HDL code. During design planning 1222, an overall floor plan for the integrated circuit is constructed and analyzed for timing and top-level routing.

During layout or physical implementation 1224, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products. Additionally, during physical implementation 1224, the HBM channel identification as described herein may be implemented to assist the creation of physical layout of HBM channels.

During analysis and extraction 1226, the circuit function is verified at the layout level, which permits refinement of the layout design. During physical verification 1228, the layout design is checked to ensure that manufacturing constraints are correct, such as DRC constraints, electrical constraints, lithographic constraints, and that circuitry function matches the HDL design specification. During resolution enhancement 1230, the geometry of the layout is transformed to improve how the circuit design is manufactured.

During tape-out, data is created to be used (after lithographic enhancements are applied if appropriate) for production of lithography masks. During mask data preparation 1232, the 'tape-out' data is used to produce lithography masks that are used to produce finished integrated circuits.

A storage subsystem of a computer system (such as computer system 1400 of FIG. 14, or host system 1307 of FIG. 13) may be used to store the programs and data structures that are used by some or all of the EDA products described herein, and products used for development of cells for the library and for physical and logical design that use the library.

Example Emulation System for Disclosed HBM Channels

Figure 13:
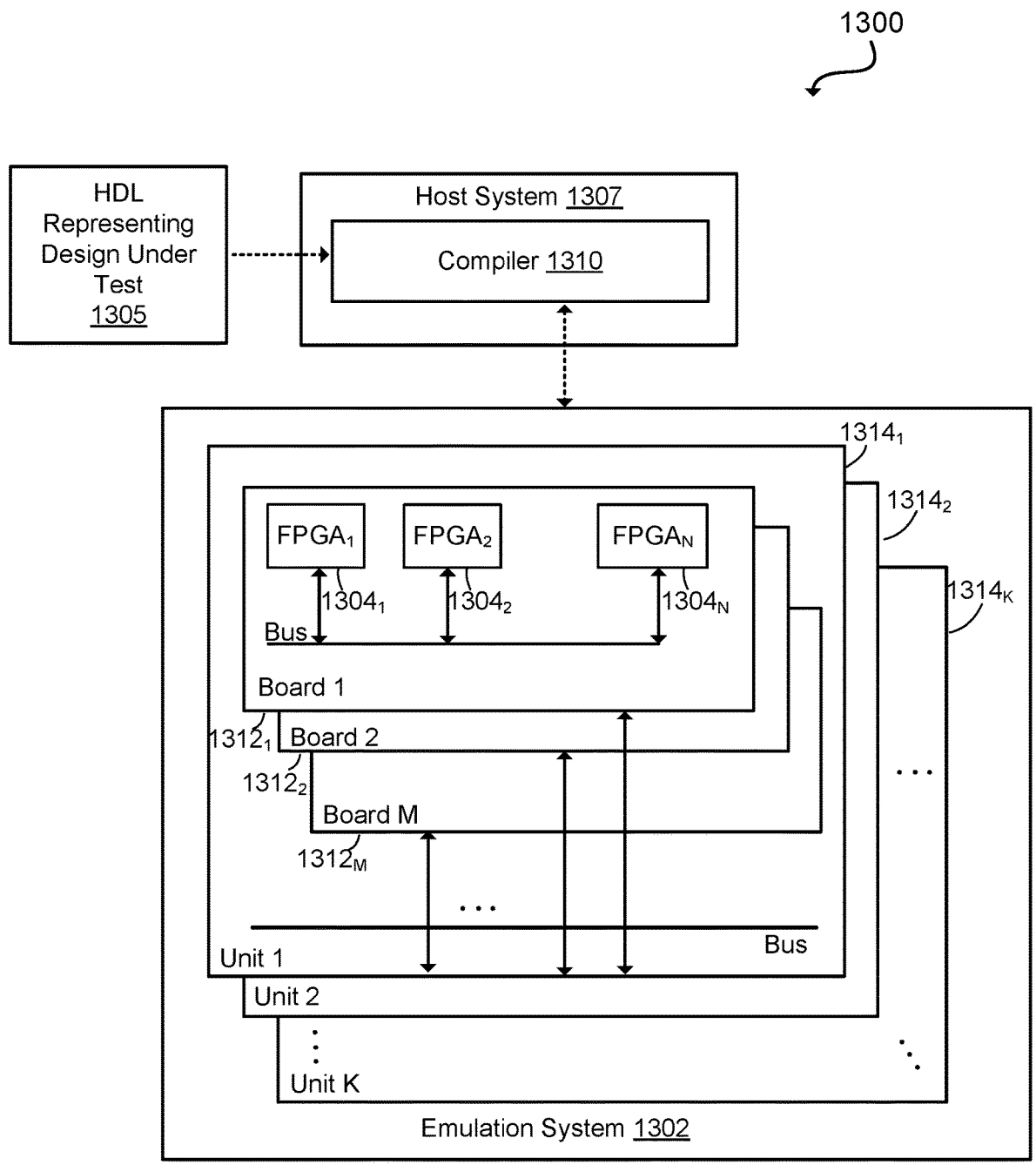
FIG. 13 depicts an abstract diagram of an example emulation system in accordance with some embodiments of the present disclosure.

FIG. 13 depicts an abstract diagram of an example emulation environment 1300. An emulation environment 1300 may be configured to verify the functionality of the circuit design. The emulation environment 1300 may include a host system 1307 (e.g., a computer that is part of an EDA system) and an emulation system 802 (e.g., a set of programmable devices such as Field Programmable Gate Arrays (FPGAs) or processors). The host system generates data and information by using a compiler 1310 to structure the emulation system to emulate a circuit design. A circuit design to be emulated is also referred to as a Design Under Test ('DUT') where data and information from the emulation are used to verify the functionality of the DUT.

The host system 1307 may include one or more processors. In the embodiment where the host system includes multiple processors, the functions described herein as being performed by the host system can be distributed among the multiple processors. The host system 1307 may include a compiler 1310 to transform specifications written in a description language that represents a DUT and to produce data (e.g., binary data) and information that is used to structure the emulation system 802 to emulate the DUT. The compiler 1310 can transform, change, restructure, add new functions to, and/or control the timing of the DUT.

The host system 1307 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1307 and emulation system 802 can exchange data and information through a third device such as a network server.

The emulation system 802 includes multiple FPGAs (or other modules) such as FPGAs 1304$_1$ and 1304$_2$ as well as additional FPGAs to 1304$_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs 1304$_1$-1304$_N$ may be placed onto one or more boards 1312$_1$ and 1312$_2$ as well as additional boards through 1312$_M$. Multiple boards can be placed into an emulation unit

1314₁. The boards within an emulation unit can be connected using the backplane of the emulation unit or any other types of connections. In addition, multiple emulation units (e.g., 1314₁ and 1314₂ through 1314_K) can be connected to each other by cables or any other means to form a multi-emulation unit system.

For a DUT that is to be emulated, the host system 1307 transmits one or more bit files to the emulation system 802. The bit files may specify a description of the DUT and may further specify partitions of the DUT created by the host system 1307 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1307 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1307 and/or the compiler 1310 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1305 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Example Computing Architecture

Figure 14:
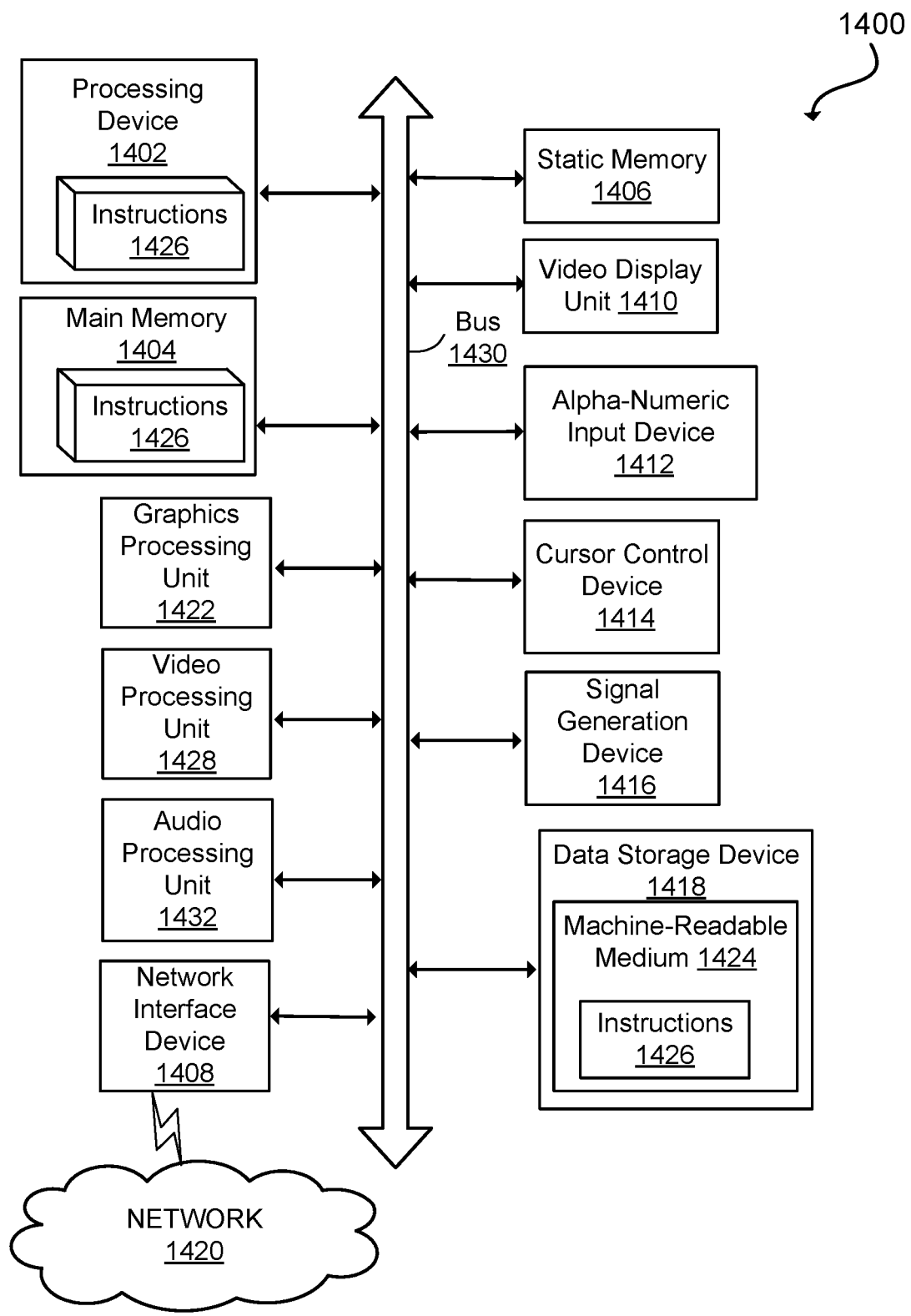
FIG. 14 depicts an abstract diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment. By way of example, some or all of the disclosed computer system 1400 may be used for computing systems running the EDA flow (or portions of it) described with FIG. 12 or may be used for some or all of the emulation system (e.g., the host system described with FIG. 12) computing configurations.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 930.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Additional Considerations

The benefits of the HBM channel identification systems and methods described herein are at least three-fold. First, the system improves the ease-of-use of HBM auto-routing tool. With the automatic identification of HBM channels, users do not need to manually collect HBM channel information for HBM auto-routing tools. Second, the system can improve the HBM routing QoR. The system determines characteristics of an HBM channel from at least the bump pattern analysis (e.g., determining the number of patterns and which patterns are in the HBM channel). The system can create an optimized number of subchannels using the bump pattern analysis (e.g., using phantom bumps to reduce the variation among patterns), which reduces processing required at an routing tool. Thus, the system automatically computes the optimal settings of the HBM router and routing guidance that help router derive the best routing result and reduce routing time. Third, the system checks the HBM channel designs for potential user design errors. A deviation of the identified HBM channels from an HBM standard can be reported to designers for verification.

The pattern reduction in bump pattern analysis performed by the present HBM channel identification systems and methods improves processing efficiency of both the present HBM channel identification system and a separate auto-routing tool (e.g., if the system is not performing the auto-routing itself). For example, when creating subchannels, an HBM channel identification system identifies if a first pattern is contained in a second pattern, and may add phantom bumps to modify the first pattern into the second pattern. These new phantom bumps can reduce the number of different patterns and thus, simplify the bump array. With a reduced number of patterns, the HBM channel identification system can more efficiently construct the subchannels of the identified HBM channel. For example, less processing is needed when the system has a reduced number of patterns which it identifies among groups of bumps. As an HBM standard (e.g., HBM2) already defines a number of patterns, the system may have difficulty finding patterns that vary too far from the standard patterns. Accordingly, by identifying whether a pattern is contained within another and modifying patterns with phantom bumps to reduce the variation among patterns, the HBM channel identification system can avoid spending processing resources finding patterns that vary too far from standardized patterns (e.g., due to user modifications). Additionally, identifying patterns that do not fit into other patterns and are not a standard pattern allows the HBM channel identification system to flag a potential error to the user, which could be difficult to identify manually among thousands of nets within a netlist of an interposer die.

The creation of subchannels is another benefit provided by the HBM channel identification system and methods described herein. Since HBM routing can follow HBM channel identification, routing nets into one or more regular patterns improves the efficiency of the automated routing (e.g., less processing is needed when the variation of patterns is smaller). Thus, dividing an HBM channel and routing each subchannel separately may help an auto-routing tool construct a uniform die structure that satisfies a quality requirement.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable medium comprising stored instructions, which when executed by a processor, cause the processor to:
   determine a bounding area comprising one or more nets from a plurality of candidate nets within a netlist;
   determine whether a gap is present between a first group of bumps and a second group of bumps within the bounding area;
   identify, responsive to determining the gap is present, a memory channel associated with the bounding area;
   determine an orientation of the memory channel associated with the bounding area; and
   create a subchannel based on the orientation.

2. The non-transitory computer readable medium of claim 1, wherein each net of the plurality of candidate nets shares a minimal net span value with at least a threshold number of other nets of the plurality of candidate nets.

3. The non-transitory computer readable medium of claim 1, wherein the instructions further comprise instructions that cause the processor to:
   determine a first histogram of horizontal net span values;
   determine a second histogram of vertical net span values;
   determine whether a net belongs to a bin in at least one of the first or second histograms having:
     a center value that meets a minimal net span value, and
     at least a threshold number of nets of the plurality of candidate nets; and
   identify, responsive to the net belonging to the bin, that the net is a candidate net of the plurality of candidate nets.

4. The non-transitory computer readable medium of claim 1, wherein the bounding area is a first bounding area, and wherein the instructions to determine the first bounding area comprising the one or more nets comprise instructions that cause the processor to:
   determine whether two or more bounding areas that bound nets from the plurality of candidate nets overlap; and
   merge, responsive to determining that the two or more bounding areas overlap, the two or more bounding areas into the first bounding area.

5. The non-transitory computer readable medium of claim 1, wherein the instructions to determine whether the gap is present between the first group of bumps and the second group of bumps within the bounding area comprise instructions that cause the processor to:
   determine that the one or more nets of the plurality of candidate nets of the bounding area is at least a threshold number of nets;
   for each of the one or more nets of the bounding area, determine a horizontal net span of the net; and
   determine the gap is present based on the horizontal net spans of the one or more nets.

6. The non-transitory computer readable medium of claim 1, wherein the instructions further comprise instructions that cause the processor to, responsive to determining the gap is present:
   determine, responsive to determining the gap is vertical, that the orientation of the memory channel is a horizontal orientation; and
   determine, responsive to determining the gap is horizontal, that the orientation of the memory channel is a vertical orientation.

7. The non-transitory computer readable medium of claim 1, wherein the instructions further comprise instructions that cause the processor to, responsive to determining the gap is present:
 determine, responsive to determining that a horizontal gap and a vertical gap are present, a bump array dimension including a bump row size and a bump column size;
 determine, responsive to determining the bump column size is smaller than the bump row size, that the orientation of the memory channel is a horizontal orientation; and
 determine, responsive to determining the bump row size is smaller than the bump column size, that the orientation of the memory channel is a vertical orientation.

8. The non-transitory computer readable medium of claim 1, wherein the orientation is a horizontal orientation, and wherein the instructions further comprise instructions that cause the processor to:
 determine vertical coordinates of respective bumps within the bounding area;
 determine horizontal coordinates of the respective bumps within the bounding area; and
 determine a pattern of bumps based on shared vertical coordinates between bumps of a first horizontal coordinate and bumps of a second horizontal coordinate, wherein the subchannel is created further based on the pattern of bumps.

9. The non-transitory computer readable medium of claim 8, wherein the pattern of bumps is a first pattern of bumps, and wherein the instructions further comprise instructions that cause the processor to:
 determine, based on the horizontal orientation, a second pattern of bumps and a third pattern of bumps within the bounding area; and
 modify a set of bumps having the third pattern of bumps by adding a phantom bump, the modified set of bumps having the second pattern of bumps, wherein the created subchannel is based on the first and second pattern of bumps.

10. The non-transitory computer readable medium of claim 8, wherein the instructions to create the subchannel based on the horizontal orientation comprise instructions that cause the processor to:
 determine that the pattern of bumps is present in a first subchannel bounding area and in a second subchannel bounding area, the first subchannel bounding area located at a first end of the memory channel and the second subchannel bounding area located at a second end of the memory channel; and
 create the subchannel comprising the first subchannel bounding area and the second subchannel bounding area.

11. A system comprising:
 a memory storing instructions; and
 a processor, coupled with the memory and to execute the instructions, the instructions when executed cause the processor to:
  determine a bounding area comprising one or more nets from a plurality of candidate nets within a netlist;
  determine whether a gap is present between a first group of bumps and a second group of bumps within the bounding area;
  identify, responsive to determining the gap is present, a memory channel associated with the bounding area;
  determine an orientation of the memory channel associated with the bounding area; and
  create a subchannel based on the orientation.

12. The system of claim 11, wherein the instructions further comprise instructions that cause the processor to:
 determine a first histogram of horizontal net span values;
 determine a second histogram of vertical net span values;
 determine whether a net belongs to a bin in at least one of the first or second histograms having:
  a center value that meets a minimal net span value, and
  at least a threshold number of nets of the plurality of candidate nets; and
 identify, responsive to the net belonging to the bin, that the net is a candidate net of the plurality of candidate nets.

13. The system of claim 11, wherein the bounding area is a first bounding area, and wherein the instructions to determine the first bounding area comprising the one or more nets comprise instructions that cause the processor to:
 determine whether two or more bounding areas that bound nets from the plurality of candidate nets overlap; and
 merge, responsive to determining that the two or more bounding areas overlap, the two or more bounding areas into the first bounding area.

14. The system of claim 11, wherein the instructions to create the subchannel based on the orientation comprise instructions that cause the processor to:
 determine that a pattern of bumps is present in a first subchannel bounding area and in a second subchannel bounding area, the first subchannel bounding area located at a first end of the memory channel and the second subchannel bounding area located at a second end of the memory channel; and
 create the subchannel comprising the first subchannel bounding area and the second subchannel bounding area.

15. The system of claim 11, wherein the instructions to determine whether the gap is present between the first group of bumps and the second group of bumps within the bounding area comprise instructions that cause the processor to:
 determine that the one or more nets of the plurality of candidate nets of the bounding area is at least a threshold number of nets;
 for each of the one or more nets of the bounding area, determine a horizontal net span of the net; and
 determine the gap is present based on the horizontal net spans of the one or more nets.

16. A method comprising:
 determining a bounding area comprising one or more nets from a plurality of candidate nets within a netlist;
 determining whether a gap is present between a first group of bumps and a second group of bumps within the bounding area;
 identifying, responsive to determining the gap is present, a memory channel associated with the bounding area;
 determining an orientation of the memory channel associated with the bounding area; and
 creating a subchannel based on the orientation.

17. The method of claim 16, further comprising:
 determining a first histogram of horizontal net span values;
 determining a second histogram of vertical net span values;
 determining whether a net belongs to a bin in at least one of the first or second histograms having:
  a center value that meets a minimal net span value, and
  at least a threshold number of nets of the plurality of candidate nets; and identifying, responsive to the net belonging to the bin, that the net is a candidate net of the plurality of candidate nets.

18. The method of claim 16, wherein the bounding area is a first bounding area, and wherein determining the first bounding area comprising the one or more nets comprises:
determining whether two or more bounding areas that bound nets from the plurality of candidate nets overlap; and
merging, responsive to determining that the two or more bounding areas overlap, the two or more bounding areas into the first bounding area.

19. The method of claim 16, wherein creating the subchannel based on the orientation comprises:
determining that a pattern of bumps is present in a first subchannel bounding area and in a second subchannel bounding area, the first subchannel bounding area located at a first end of the memory channel and the second subchannel bounding area located at a second end of the memory channel; and
creating the subchannel comprising the first subchannel bounding area and the second subchannel bounding area.

20. The method of claim 16, wherein determining whether the gap is present between the first group of bumps and the second group of bumps within the bounding area comprises:
determining that the one or more nets of the plurality of candidate nets of the bounding area is at least a threshold number of nets;
for each of the one or more nets of the bounding area, determining a horizontal net span of the net; and
determining the gap is present based on the horizontal net spans of the one or more nets.

* * * * *